DIFFERENTIAL AMPLIFIER AND FIELD EFFECT TRANSISTOR GATES FOR APPLYING LARGEST OF TWO INPUTS TO OUTPUT

Filed May 17, 1967

INVENTOR.
ROBERT E. BICKING
BY Bruce C Lutz
ATTORNEY

United States Patent Office 3,502,905
Patented Mar. 24, 1970

3,502,905

DIFFERENTIAL AMPLIFIER AND FIELD EFFECT TRANSISTOR GATES FOR APPLYING LARGEST OF TWO INPUTS TO OUTPUT

Robert E. Bicking, Brooklyn Center, Minn., assignor to Honeywell Inc., Minneapolis, Minn., a corporation of Delaware Filed May 17, 1967, Ser. No. 639,211
Int. Cl. H03k 5/20
U.S. Cl. 307—235 1 Claim

ABSTRACT OF THE DISCLOSURE

A most positive signal selector which compares two signals and selects the larger of the two signals as an output. A high gain differential amplifier is used to sense the difference between the two signals and to drive field effect transistors to conduct the larger of the two signals to the output and inhibit the smaller.

BACKGROUND

This invention relates generally to the field of electrical circuitry, and specifically to an electrical circuit which will select the most positive of two electrical signals and transmit that signal to the output.

In the prior art, circuits for selecting the most positive of two electrical signals have been developed. The most common of these circuits is the simple diode gate. One of the problems involved with using an ordinary diode gate is the large amount of error introduced by the voltage drop across the diodes. The present invention solves the prior art problem of errors introduced by the voltage drop across the gate diodes.

This invention was developed in response to a need for an accurate most positive signal selector which has excellent small signal linearity. The invention satisfies this need by using an extremely high gain differential amplifier to sense the difference between the two input signals and by using field effect transistors to conduct the signal thus eliminating the errors introduced due to the characteristics of ordinary diodes.

DESCRIPTION

This invention provides a most positive analogue signal selector wherein a differential amplifier senses the difference in the input signals and provides an output to field effect transistors in series with the input signals and controls the field effect transistors to block the least positive input signal and conduct the most positive input signal directly to the output of the circuit.

It is an object of this invention to provide a circuit for selecting the most positive of two analogue signals.

It is a further object of this invention to provide a most positive analogue signal selector which has very high sensitivity.

It is a still further object of this invention to provide a most positive analogue signal selector with excellent small signal linearity.

Further objects and advantages will become apparent from a reading of the specification and claim in conjunction with the drawings wherein:

Figure 1:
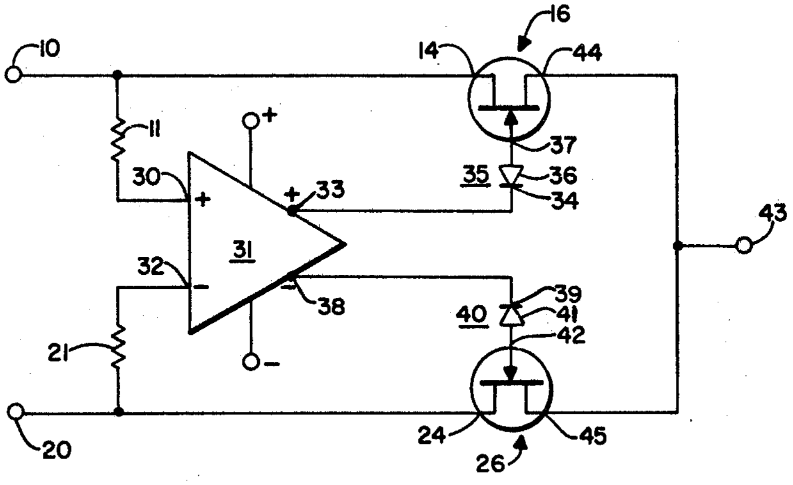
FIGURE 1 is a schematic representation of a most positive analogue signal selector using a differential amplifier and n-channel field effect transistors.

In FIGURE 1, a signal input means 10 is connected to one end of a resistance means 11 and also to an input terminal or source means 14 of a voltage operated current control means or field effect transistor means 16. All future references to field effect transistors in this specification will be abbreviated FET. A signal input means 20 is connected to one end of a resistance means 21 and also an input terminal or a source means 24 of an FET 26.

The other end of resistance means 11 is connected to the non-inverting input 30 of a differential amplifier means 31. The other end of resistance means 21 is connected to the inverting input 32 of the differential amplifier means 31. Amplifier 31 is connected to a positive and a negative source of D.C. power supply voltage. The non-inverting output means 33 of the differential amplifier means 31 is connected to a cathode 34 of a diode 35. An anode 36 of the diode 35 is connected to a gate means 37 of FET 16. The inverting output means 38 is connected to cathode 39 of a second diode 40. An anode 41 of a diode 40 is connected to a gate means 42 of the FET 26. An analogue signal selector output means 43 is connected to an output terminal or drain means 44 of FET 16 and also to an output terminal of drain means 45 of FET 26.

Figure 2:
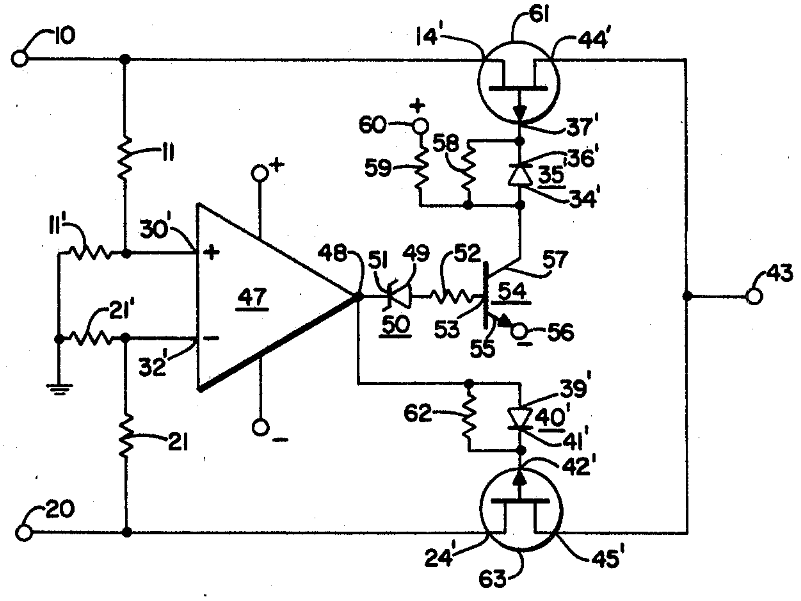
FIGURE 2 is a schematic of a most positive analogue signal selector using p-channel field effect transistors.

The analogue signal selector circuit may be alternately mechanized using an amplifier with a single ended output and p-channel field effect transistors. An example of this type circuit is shown in FIGURE 2. In this figure, elements 10, 11, 14, 20, 21 are the same as and connected in the same way as shown in FIGURE 1. A third resistance means 11′ and a fourth resistance means 21′ are connected respectively between inverting input 30′ and ground and between non-inverting input 32′ and ground. The differential amplifier 47 has a single ended output 48 which is connected to a cathode 51 of a Zener diode 50 and also, to an anode 40′ of a second diode 41′. Amplifier 47 is also connected to a positive and a negative source of power supply voltage. An anode 49 of a Zener diode 50 is connected through a resistance means 52 to a base 53 of an NPN transistor means 54. An emitter 55 of NPN transistor means 54 is connected to a negative voltage source 56 and a collector 57 is connected to an anode 34 of a diode 35′ and also to one end of a resistance means 58 and a resistance means 59. The other end of resistance means 59 is connected to a positive voltage source 60. The other end of resistance means 58 is connected to a cathode 36′ of diode 35′ and a gate means 37′ of a p-channel FET 61 and resistance means 62 is connected between the anode 39′ and the cathode 41′ of diode 40′. The drain means 44′ of the p-channel FET 61 and the drain means 45 of the p-channel FET 63 are connected to the analogue signal selector output means 43.

OPERATION

With reference to FIGURE 1, a first positive voltage is applied to the signal input 10 and a second positive voltage is applied to the signal input 20. The differential amplifier 31 provides an output which is equal to its open-loop gain multiplied by the difference between input currents supplied through resistor 11 to the non-inverting input 30 and the input current supplied through resistor 21 to the inverting input 32. When the current flowing into the non-inverting input 30 exceeds the current flowing into the inverting input 32 there will be a positive polarity voltage at the non-inverting output 33 and a negative polarity voltage at the inverting output 38. Since the open-loop gain of the differential amplifier 31 is extremely high, a small difference in the input voltages applied to signal input 10 and signal input 20 will result in saturation of the differential amplifier causing the inverting and non-inverting outputs to be equal to the respective power supply voltages.

When the signal at input 10 is larger than the signal at input 20, the voltage at non-inverting output 33 is a large positive voltage which back-biases first diode 35 allowing the n-channel FET 16 to switch to a low resistance mode. The input signal at 10 is thus conducted through a low ressitance path between the source 14 and the drain 44 of FET 16 to the output 43. When the voltage at the non-inverting output 33 is at a large positive value, the voltage at the inverting output 38 has at a large negative value thereby forward-biasing diode 40 and back-biasing the FET 26 such that a very high resistance path is provided between the signal input 20 and the output 43. The operation of the circiut is similar except reversed for signals at input 20 which are larger than signals at input 10. Thus, the circuit operates by providing a low resistance path between the most positive of the two signal inputs 10 or 20 and the output 43. A very high resistance path is created between the least positive of the two signal inputs and the output 43. Because a forward-biased FET has no inherent diode off-set voltage, the linearity of the circuit will be excellent at low signal levels.

With reference to FIGURE 2, the differential amplifier 47 provides a postive output at amplifier output terminal 48 when the voltage at input 10 is more positive than the voltage at input 20. The positive voltage at amplifier output terminal 48 forward-biases diode 40′ and reverse biases the FET 63. The positive voltage at amplifier output terminal 48 is also connected to the FET 61 through the inverter stage which applies a large negative voltage to back-bias the diode 36′ and forward-bias the FET 61. Diode 35′ is used to prevent damage to the FET gate 37′ which would result from a large forward bias. The resistor 58 connected in parallel with diode 35 is used to provide a high impedance shunt path for the diode in order to allow a small gate current to flow to switch field effect transistor 61 to the low impedance mode. For conditions wherein the voltage at input 20 is larger than the voltage at input 10 the operation of the circuit is similar to the above description with the exception that FET 63 is in a low resistance mode and FET 61 is back-biased and in the high resistance mode.

The circuit may also be mechanized using other switches such as MOS field effect transistors which would allow for the removal of diodes 36 and 40 because the back-bias voltage would not damage the gate channel junctions.

Conventional transistors could also be used to replace the FET switches but performance degradation may result from the inherent offset voltage of a saturated transistor.

It is obvious that the n-channel FET's shown in FIGURE 1 can be replaced by p-channel FET's and the p-channel FET's in FIGURE 2 may be replaced by n-channel FET's by making only minor modifications to the circuitry shown.

The circuit may be made to function as a most negative signal selector by reversing the polarity of the drive signals applied to the FET's.

Other alterations and variations will be obvious to those skilled in the art. I do not wish to be limited to the specification or the preferred embodiment shown in the figures but only by the following claim.

I claim:

1. Apparatus of the class described, comprising:

a first signal input terminal and a second signal input terminal;

output terminal means;

differential amplifier means including output means and first input means and second input means;

first and second field effect transistor means including source means, drain means, and gate means;

means connecting said first signal input terminal to the input means of said differential amplifier means and the source means of said first field effect transistor means;

means connecting said second input terminal to the second input means of said differential amplifier means and the source means of said second field effect transistor means;

means connecting the output means of said differential amplifier means to the gate means of said first field effect transistor means such that said first field effect transistor means has a low resistance between its source means and drain means when the signal applied to said first signal input means is more positive than the signal applied to said second signal input means;

means connecting the output means of said differential amplifier means to the gate means of said second field effect transistor means such that said second field effect transistor means has a low ressitance between its source means and drain means when the input voltage applied to said second signal input means is more positive than the input voltage applied to said first signal input means; and means connecting the drain means of said first field effect transistor means and the drain means of said second field effect transistor means to the output means.

References Cited

UNITED STATES PATENTS

| | | | |
|---|---|---|---|
| 3,026,455 | 3/1962 | Smith | 330—69 XR |
| 3,283,322 | 11/1966 | Houda et al. | 307—235 X |

JOHN S. HEYMAN, Primary Examiner

STANLEY D. MILLER, Assistant Examiner

U.S. Cl. X.R.

307—236, 243, 251; 330—30